US012336390B2

(12) United States Patent
Zhao (10) Patent No.: US 12,336,390 B2
(45) Date of Patent: Jun. 17, 2025

(54) DISPLAY PANEL, MANUFACTURING METHOD THEREOF, AND DISPLAY TERMINAL (71) Applicants: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

(72) Inventor: Yun Zhao, Guangdong (CN)

(73) Assignees: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/623,055

(22) PCT Filed: Dec. 22, 2021

(86) PCT No.: PCT/CN2021/140417
§ 371 (c)(1),
(2) Date: Dec. 27, 2021

(87) PCT Pub. No.: WO2023/103095
PCT Pub. Date: Jun. 15, 2023

(65) Prior Publication Data
US 2024/0049512 A1 Feb. 8, 2024

(30) Foreign Application Priority Data
Dec. 10, 2021 (CN) .......................... 202111508307.9

(51) Int. Cl.
H10K 59/122 (2023.01)
H10K 59/12 (2023.01)
H10K 59/173 (2023.01)

(52) U.S. Cl.
CPC ....... *H10K 59/122* (2023.02); *H10K 59/1201* (2023.02); *H10K 59/173* (2023.02)

(58) Field of Classification Search
CPC ........... H10K 59/122; H10K 59/80521; H10K 59/8722; H10K 59/873
See application file for complete search history.

(56) References Cited

U.S. PATENT DOCUMENTS 9,502,678 B2 * 11/2016 Luo .................... H10K 50/8426
2007/0046188 A1 3/2007 Liu
(Continued)

FOREIGN PATENT DOCUMENTS

CN 103137654 A 6/2013
CN 203707190 U 7/2014
(Continued)

OTHER PUBLICATIONS

Chinese Office Action issued in corresponding Chinese Patent Application No. 202111508307.9 dated Jan. 13, 2024, pp. 1-9.
(Continued)

Primary Examiner — Matthew L Reames
(74) Attorney, Agent, or Firm — PV IP PC; Christopher S. Ruprecht; Wei Te Chung (57) ABSTRACT A display panel, a manufacturing method thereof, and a display terminal are provided. The display panel includes a substrate layer, an anode layer, a pixel separating layer, an organic light-emitting layer, and a cathode layer. The pixel separating layer includes a plurality of pixel opening regions and a non-opening region disposed between two adjacent pixel opening regions. The cathode layer includes at least
(Continued)

one via hole corresponding to the non-opening region of the pixel separating layer.

12 Claims, 3 Drawing Sheets

(56) References Cited

U.S. PATENT DOCUMENTS

| | | | |
|---|---|---|---|
| 2017/0250236 | A1 | 8/2017 | Xiong |
| 2020/0212155 | A1* | 7/2020 | Mitani ................. H10K 59/131 |
| 2020/0335727 | A1* | 10/2020 | Makishima .......... H10K 59/874 |

FOREIGN PATENT DOCUMENTS

| | | |
|---|---|---|
| CN | 107369702 A | 11/2017 |
| CN | 109742122 A | 5/2019 |
| CN | 109755280 A | 5/2019 |
| CN | 110071162 A | 7/2019 |
| CN | 110137384 A | 8/2019 |
| CN | 110739340 A | 1/2020 |
| CN | 111463356 A | 7/2020 |
| CN | 111653595 A | 9/2020 |
| CN | 111785742 A | 10/2020 |
| CN | 111952341 A | 11/2020 |
| CN | 112993181 A | 6/2021 |
| CN | 113270558 A | 8/2021 |
| CN | 113594213 A | 11/2021 |
| KR | 20190054563 A | 5/2019 |

OTHER PUBLICATIONS

International Search Report in International application No. PCT/CN2021/140417, mailed on Aug. 25, 2022.

Written Opinion of the International Searching Authority in International application No. PCT/CN2021/140417, mailed on Aug. 25, 2022.

* cited by examiner

- forming an anode layer on a substrate layer, wherein the anode layer comprises a plurality of anodes — S1
- forming a pixel separating layer on the substrate layer, wherein the pixel separating layer comprises a plurality of pixel opening regions and a non-opening region disposed between two adjacent pixel opening regions, and one of the pixel opening regions corresponds to one of the anodes — S2
- forming an organic light-emitting layer on the anode layer and the pixel separating layer — S3
- forming a cathode layer on the organic light-emitting layer — S4
- forming at least one via hole on the cathode layer corresponding to the non-opening region of the pixel separating layer — S5

FIG. 6

DISPLAY PANEL, MANUFACTURING METHOD THEREOF, AND DISPLAY TERMINAL

FIELD OF DISCLOSURE

The present disclosure relates to the field of display technologies, in particular to a display panel, a manufacturing method thereof, and a display terminal.

BACKGROUND

An organic light-emitting diode (OLED) display panel is a new type of a flat panel display technology with high contrast and fast response speed. The OLED display panel is very sensitive to moisture and is extremely susceptible to defects.

A pixel separating layer is formed between sub-pixels of a display panel to prevent short circuit between a cathode and an anode of the display panel. Usually, the pixel separating layer is made of an organic material (especially, a polymer material). Under high temperature, ultraviolet radiation, or other conditions, the polymer material will release small molecules. The small molecules push up the cathode, so a contact state between the cathode and an organic light-emitting layer is destroyed. Furthermore, the released small molecules (such as, water molecules or other molecules) react with the cathode (usually being active metals, such as magnesium, aluminum, and silver), which will damage the cathode, cause poor contact between film layers (especially, the cathode and the organic light-emitting layer) of the display pane, and cause poor light emission at edges of the sub-pixel of the display panel (decreased brightness or not bright).

SUMMARY OF DISCLOSURE

Embodiments of the present disclosure provide a display panel, which solve technical problems that a pixel separating layer of a display panel in the prior art releases small molecules, resulting in poor contact between a cathode and an organic light-emitting layer, and poor light emission at edges of sub-pixels.

An embodiment of the present disclosure provides a display panel, including a substrate layer, an anode layer, a pixel separating layer, an organic light-emitting layer, and a cathode layer. The anode layer is disposed on the substrate layer and includes a plurality of anodes. The pixel separating layer is disposed on the substrate layer. The pixel separating layer includes a plurality of pixel opening regions and a non-opening region disposed between two adjacent pixel opening regions, and one of the pixel opening regions corresponds to one of the anodes. The organic light-emitting layer is disposed on the anode layer and the pixel separating layer. The cathode layer is disposed on the organic light-emitting layer. The cathode layer includes at least one via hole corresponding to the non-opening region of the pixel separating layer.

In the display panel of the embodiment of the present disclosure, the display panel further includes a barrier layer, and the barrier layer covers the cathode layer.

In the display panel of the embodiment of the present disclosure, the barrier layer includes at least one organic layer and at least one inorganic layer, and the organic layer and the inorganic layer are stacked.

In the display panel of the embodiment of the present disclosure, material of the inorganic layer is silicon dioxide, silicon nitride, silicon oxynitride, or aluminum oxide.

In the display panel of the embodiment of the present disclosure, the display panel further includes a cover layer and an adhesive layer disposed on one surface of the cover layer. The cover layer is attached to a surface of the barrier layer away from the cathode layer through the adhesive layer.

In the display panel of the embodiment of the present disclosure, the display panel further includes g a cover layer and a sealant layer. The cover layer is disposed on a surface of the barrier layer away from the cathode layer, the sealant layer is formed on a periphery of a surface of the cover layer facing the substrate layer, and the cover layer is attached to the substrate layer through the sealant layer.

In the display panel of the embodiment of the present disclosure, the cover layer further includes a gas absorption layer and an adhesive layer disposed on the surface facing the substrate layer, the adhesive layer is disposed inside the sealant layer, and the gas absorption layer is disposed between the adhesive layer and the sealant layer.

In the display panel of the embodiment of the present disclosure, the gas absorption layer is a desiccant, the adhesive layer is a transparent optical adhesive, and the sealant layer is a light-shielding adhesive.

In the display panel of the embodiment of the present disclosure, an orthographic projection of the via hole on the pixel separating layer is within the non-opening region of the pixel separating layer.

An embodiment of the present disclosure also provides a manufacturing method of a display panel, including: forming an anode layer on a substrate layer, wherein the anode layer includes a plurality of anodes; forming a pixel separating layer on the substrate layer, wherein the pixel separating layer includes a plurality of pixel opening regions and a non-opening region disposed between two adjacent pixel opening regions, and one of the pixel opening regions corresponds to one of the anodes; forming an organic light-emitting layer on the anode layer and the pixel separating layer; forming a cathode layer on the organic light-emitting layer; and forming at least one via hole on the cathode layer corresponding to the non-opening region of the pixel separating layer.

In the manufacturing method of the display panel of the embodiment of the present disclosure, the manufacturing method further includes: forming a barrier layer on the cathode layer, wherein the barrier layer covers the cathode layer.

In the manufacturing method of the display panel of the embodiment of the present disclosure, the barrier layer includes at least one organic layer and at least one inorganic layer, and the organic layer and the inorganic layer are stacked.

In the manufacturing method of the display panel of the embodiment of the present disclosure, material of the inorganic layer is silicon dioxide, silicon nitride, silicon oxynitride, or aluminum oxide.

In the manufacturing method of the display panel of the embodiment of the present disclosure, the manufacturing method further includes: providing a cover layer, attaching an adhesive layer to one surface of the cover layer, and attaching the cover layer to a surface of the barrier layer away from the cathode layer through the adhesive layer.

In the manufacturing method of the display panel of the embodiment of the present disclosure, the manufacturing method further includes: providing a cover layer, wherein the cover layer is disposed on a surface of the barrier layer away from the cathode layer, a sealant layer is attached to a periphery of a surface of the cover layer facing the substrate layer, and the cover layer is attached to the substrate layer through the sealant layer.

In the manufacturing method of the display panel of the embodiment of the present disclosure, the cover layer further includes a gas absorption layer and an adhesive layer disposed on the surface facing the substrate layer, the adhesive layer is disposed inside the sealant layer, and the gas absorption layer is disposed between the adhesive layer and the sealant layer.

In the manufacturing method of the display panel of the embodiment of the present disclosure, the gas absorption layer is a desiccant, the adhesive layer is a transparent optical adhesive, and the sealant layer is a light-shielding adhesive.

An embodiment of the present disclosure also provides a display terminal, including a terminal main body and a display panel. The terminal main body and the display panel are assembled together. The display panel includes a substrate layer, an anode layer, a pixel separating layer, an organic light-emitting layer, and a cathode layer. The anode layer is disposed on the substrate layer and includes a plurality of anodes. The pixel separating layer is disposed on the substrate layer. The pixel separating layer includes a plurality of pixel opening regions and a non-opening region disposed between two adjacent pixel opening regions, and one of the pixel opening regions corresponds to one of the anodes. The organic light-emitting layer is disposed on the anode layer and the pixel separating layer. The cathode layer is disposed on the organic light-emitting layer. The cathode layer includes at least one via hole corresponding to the non-opening region of the pixel separating layer.

In the display terminal of the embodiment of the present disclosure, the display panel further includes a barrier layer, and the barrier layer covers the cathode layer.

In the display terminal of the embodiment of the present disclosure, the barrier layer includes at least one organic layer and at least one inorganic layer, and the organic layer and the inorganic layer are stacked.

The embodiment of the present disclosure provides the display panel, including the substrate layer, the anode layer, the pixel separating layer, the organic light-emitting layer, and the cathode layer. The anode layer is disposed on the substrate layer and includes the plurality of anodes. The pixel separating layer is disposed on the substrate layer. The pixel separating layer includes the plurality of pixel opening regions and the non-opening region disposed between two adjacent pixel opening regions, and one of the pixel opening regions corresponds to one of the anodes. The organic light-emitting layer is disposed on the anode layer and the pixel separating layer. The cathode layer is disposed on the organic light-emitting layer. The cathode layer includes at least one via hole corresponding to the non-opening region of the pixel separating layer. In the present disclosure, the cathode layer is provided with the at least one via hole corresponding to the non-opening region of the pixel separating layer. If the pixel separating layer releases small molecules due to high temperature or ultraviolet radiation, the small molecules can be discharged from the display panel through this via hole. It prevents the molecules from being released between the cathode and the anode of the display panel and damaging a contact interface between the cathode and the organic light-emitting layer. It prevents poor light emission at edges of sub-pixels and improves the reliability of the display panel.

BRIEF DESCRIPTION OF DRAWINGS

In order to more clearly describe technical solutions in the embodiments of the present disclosure, the following will briefly introduce the drawings needed in the description of the embodiments.

DETAILED DESCRIPTION

The technical solutions in the embodiments of the present disclosure will be clearly and completely described below in conjunction with the drawings in the embodiments of the present disclosure. In the drawings, for clarity and ease of understanding and description, sizes and thicknesses of the components shown in the drawings are not to scale.

Figure 1:
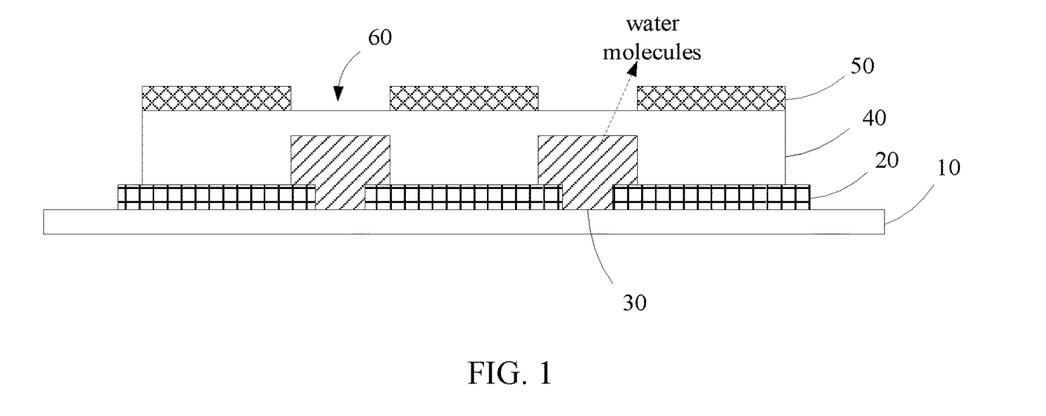
FIG. 1 is a schematic diagram of a basic structure of a display panel of an embodiment of the present disclosure.

FIG. 1 is a schematic diagram of a basic structure of a display panel of an embodiment of the present disclosure. The display panel includes a substrate layer 10, an anode layer 20, a pixel separating layer 30, an organic light-emitting layer 40, and a cathode layer 50. The anode layer 20 is disposed on the substrate layer 10. The anode layer 20 includes a plurality of anodes. The pixel separating layer 30 is disposed on the substrate layer 10. The pixel separating layer 30 includes a plurality of pixel opening regions and a non-opening region disposed between two adjacent pixel opening regions. One of the pixel opening regions corresponds to one of the anodes. The organic light-emitting layer 40 is disposed on the anode layer 20 and the pixel separating layer 30. The cathode layer 50 is disposed on the organic light-emitting layer 40. The cathode layer 50 is provided with at least one via hole 60 corresponding to the non-opening region of the pixel separating layer 30.

It should be noted that a driving circuit layer (not shown) is also provided between the substrate layer 10 and the anode layer 20. The driving circuit layer is electrically connected to the anode layer 20 to provide a driving voltage for the anode layer 20. The organic light-emitting layer 40 specifically includes a hole transport layer, a light-emitting material layer, and an electron transport layer. The hole transport layer and the light-emitting material layer are disposed in the pixel opening regions of the pixel separating layer 30. The light-emitting material layer is disposed on the hole transport layer. The electron transport layer is disposed on the light-emitting material layer and the pixel separating layer 30. The anode layer 20 generates holes. The holes enter the light-emitting material layer from the hole transport layer. The cathode layer 50 generates electrons. The electrons enter the light-emitting material layer from the electron transport layer. The holes and the electrons recombine in the light-emitting material layer to generate excitons. The excitons migrate under an action of an electric field between the anode layer 20 and the cathode layer 50 to generate photons and release energy.

It is understandable that the pixel separating layer 30 is usually made of an organic material (especially, a polymer material). Under high temperature or ultraviolet radiation, the polymer material will release small molecules. The small molecules push up the cathode layer 50, so a contact state between the cathode layer 50 and the organic light-emitting layer 40 is destroyed. Moreover, the released small molecules (such as, water molecules or other molecules) react with the cathode layer 50 (usually being active metals, such as magnesium, aluminum, and silver), which will damage the cathode layer 50, cause poor contact between film layers (especially, the cathode layer 50 and the organic light-emitting layer 4) of the display panel, and cause poor light emission at edges of the sub-pixel of the display panel. In the present disclosure, the cathode layer 50 is provided with the at least one via hole 60 corresponding to the non-opening region of the pixel separating layer 30. If the pixel separating layer 30 releases small molecules (e.g., water molecules) due to high temperature or ultraviolet radiation, the small molecules can be discharged from the display panel through this via hole. It prevents the molecules from being released between the cathode layer 50 and the anode layer 20 of the display panel and damaging a contact interface between the cathode layer 50 and the organic light-emitting layer 40. It prevents poor light emission at edges of sub-pixels and improves the reliability of the display panel.

Figure 2:
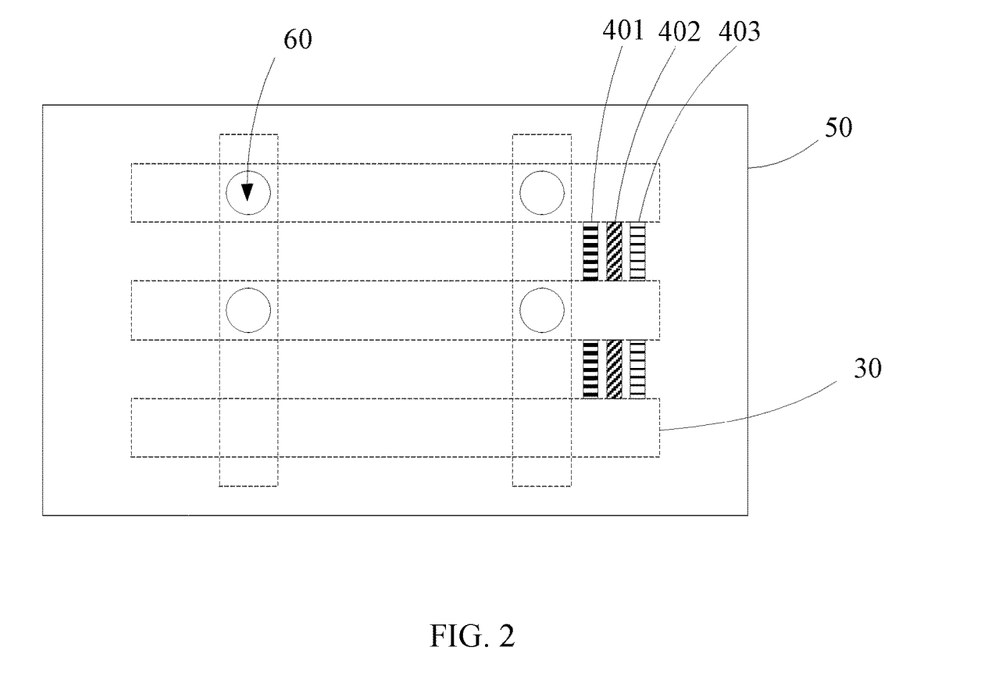
FIG. 2 is a top view of a display panel of an embodiment of the present disclosure.

Referring to FIG. 2, which is a top view of a display panel of an embodiment of the present disclosure. As can be seen from FIG. 2, an orthographic projection of the via hole 60 of the cathode layer 50 on the pixel separating layer 30 is within the non-opening region of the pixel separating layer 30. It can be understood that a region where the via hole 60 is formed is a region without the cathode layer 50. In the embodiment of the present disclosure, the orthographic projection of the via hole 60 on the pixel separating layer 30 is within the non-opening region of the pixel separating layer 30 (i.e., the region without the cathode layer 50 is in the non-opening region of the pixel separating layer 30). Thus, the cathode layer 50 in the pixel opening regions will not be reduced, and an electric field between the cathode layer 50 and the anode layer 20 (as shown in FIG. 1) in the pixel opening regions will not be affected.

In an embodiment, in the top view of the display panel, a shape of the via hole 60 is a circle (as shown in FIG. 2), an ellipse, or a polygon. It can be understood that FIG. 2 only takes the shape of the via hole 60 as the circle as an example for drawing. In other embodiments, the shape of the via hole 60 may also be a square or a special shape.

In an embodiment, the pixel opening regions of the pixel separating layer 30 include red sub-pixels 401, green sub-pixels 402, and blue sub-pixels 403.

Figure 3:
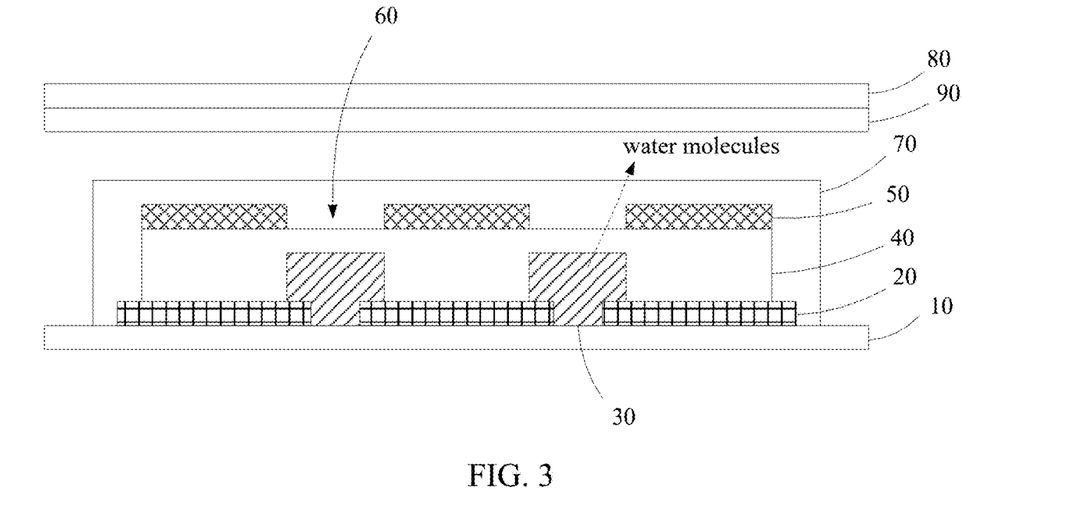
FIG. 3 is a schematic diagram of a basic structure of another display panel of an embodiment of the present disclosure.

Referring to FIG. 3, which is a schematic diagram of a basic structure of another display panel of an embodiment of the present disclosure. The display panel includes a substrate layer 10, an anode layer 20, a pixel separating layer 30, an organic light-emitting layer 40, and a cathode layer 50. The anode layer 20 is disposed on the substrate layer 10. The anode layer 20 includes a plurality of anodes. The pixel separating layer 30 is disposed on the substrate layer 10. The pixel separating layer 30 includes a plurality of pixel opening regions and a non-opening region disposed between two adjacent pixel opening regions. One of the pixel opening regions corresponds to one of the anodes. The organic light-emitting layer 40 is disposed on the anode layer 20 and the pixel separating layer 30. The cathode layer 50 is disposed on the organic light-emitting layer 40. The cathode layer 50 is provided with at least one via hole 60 corresponding to the non-opening region of the pixel separating layer 30.

In this embodiment, the display panel further includes a barrier layer 70. The barrier layer 70 covers the cathode layer 50. It is understandable that in the embodiment of the present disclosure, the cathode layer 50 is provided with the at least one via hole 60 corresponding to the non-opening region of the pixel separating layer 30 to discharge small molecules (such as, water molecules) released by the pixel separating layer 30. However, external molecules may enter the organic light-emitting layer 40 through the via hole 60, causing poor light emission. In this embodiment, the barrier layer 70 is provided on the cathode layer 50, the problem of entry of the external molecules caused by the via hole 60 can be improved.

It should be noted that although the small molecules (such as, water molecules) released by the internal pixel separating layer 30 cannot be discharged through the barrier layer 70 in a short time, the internal water molecules will not accumulate between the cathode layer 50 and the organic light-emitting layer 40 and damage the contact state between the cathode layer 50 and the organic light-emitting layer 40. The internal water molecules will move between the barrier layer 70 and the cathode layer 50. Because the barrier layer 70 has a certain water permeability (a water vapor transmission rate WVTR is about 10-3 g/m2*day), the water molecules will slowly dissipate over time. Therefore, the barrier layer 70 will not affect the cathode layer 50 and the organic light-emitting layer 40, and can also block external molecules.

In an embodiment, the barrier layer 70 includes at least one organic layer and at least one inorganic layer. The organic layer and the inorganic layer are stacked. The organic layer is formed by an evaporation process. The inorganic layer is formed by a chemical vapor deposition process. Material of the inorganic layer is, for example, silicon dioxide, silicon nitride, silicon oxynitride, or aluminum oxide.

In an embodiment, the display panel further includes a cover layer 80 and an adhesive layer 90 disposed on one surface of the cover layer 80. The cover layer 80 is attached to a surface of the barrier layer 70 away from the cathode layer 50 through the adhesive layer 90.

Figure 4:
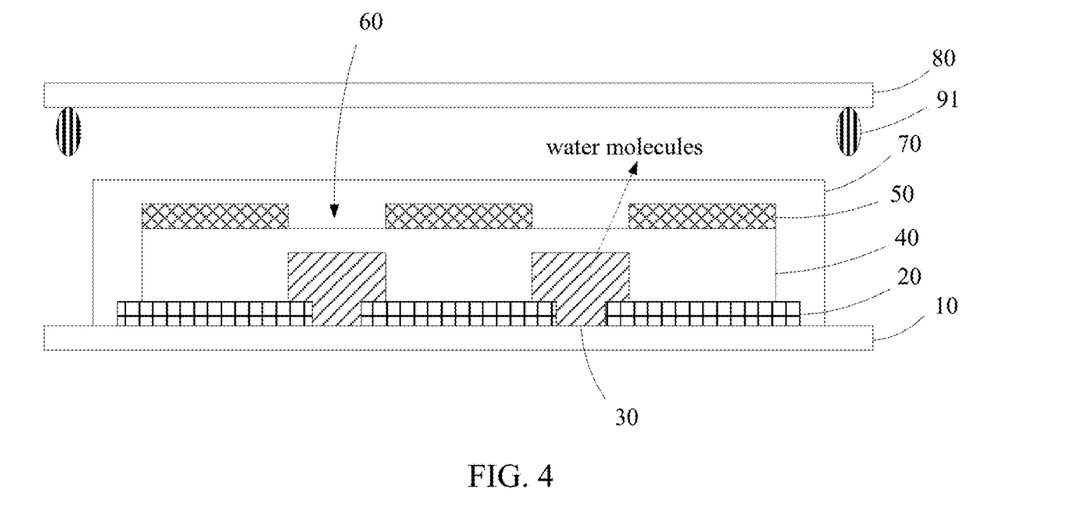
FIG. 4 is a schematic diagram of a basic structure of another display panel of an embodiment of the present disclosure.

Referring to FIG. 4, which is a schematic diagram of a basic structure of another display panel of an embodiment of the present disclosure. The display panel includes a substrate layer 10, an anode layer 20, a pixel separating layer 30, an organic light-emitting layer 40, and a cathode layer 50. The anode layer 20 is disposed on the substrate layer 10. The anode layer 20 includes a plurality of anodes. The pixel separating layer 30 is disposed on the substrate layer 10. The pixel separating layer 30 includes a plurality of pixel opening regions and a non-opening region disposed between two adjacent pixel opening regions. One of the pixel opening regions corresponds to one of the anodes. The organic light-emitting layer 40 is disposed on the anode layer 20 and the pixel separating layer 30. The cathode layer 50 is disposed on the organic light-emitting layer 40. The cathode layer 50 is provided with at least one via hole 60 corresponding to the non-opening region of the pixel separating layer 30.

In this embodiment, the display panel further includes a barrier layer 70. The barrier layer 70 covers the cathode layer 50. It is understandable that in the embodiment of the present disclosure, the cathode layer 50 is provided with the at least one via hole 60 corresponding to the non-opening region of the pixel separating layer 30 to discharge small molecules (such as, water molecules) released by the pixel separating layer 30. However, external molecules may enter the organic light-emitting layer 40 through the via hole 60, causing poor light emission. In this embodiment, the barrier layer 70 is provided on the cathode layer 50, the problem of entry of the external molecules caused by the via hole 60 can be improved.

In an embodiment, the display panel further includes a cover layer 80. The cover layer 80 is disposed on a surface of the barrier layer 70 away from the cathode layer 50. A sealant layer 91 is formed on a periphery of a surface of the cover layer 80 facing the substrate layer 10. The cover layer 80 is attached to the substrate layer 10 through the sealant layer 91.

Figure 5:
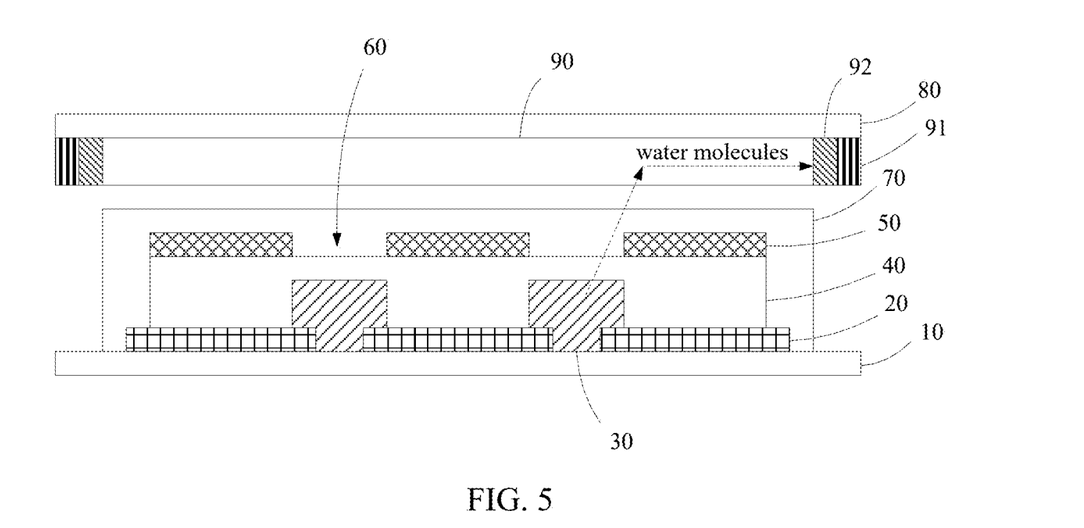
FIG. 5 is a schematic diagram of a basic structure of another display panel of an embodiment of the present disclosure.

Referring to FIG. 5, which is a schematic diagram of a basic structure of another display panel of an embodiment of the present disclosure. The display panel includes a substrate layer 10, an anode layer 20, a pixel separating layer 30, an organic light-emitting layer 40, and a cathode layer 50. The anode layer 20 is disposed on the substrate layer 10. The anode layer 20 includes a plurality of anodes. The pixel separating layer 30 is disposed on the substrate layer 10. The pixel separating layer 30 includes a plurality of pixel opening regions and a non-opening region disposed between two adjacent pixel opening regions. One of the pixel opening regions corresponds to one of the anodes. The organic light-emitting layer 40 is disposed on the anode layer 20 and the pixel separating layer 30. The cathode layer 50 is disposed on the organic light-emitting layer 40. The cathode layer 50 is provided with at least one via hole 60 corresponding to the non-opening region of the pixel separating layer 30.

In this embodiment, the display panel further includes a barrier layer 70. The barrier layer 70 covers the cathode layer 50. It is understandable that in the embodiment of the present disclosure, the cathode layer 50 is provided with the at least one via hole 60 corresponding to the non-opening region of the pixel separating layer 30 to discharge small molecules (such as, water molecules) released by the pixel separating layer 30. However, external molecules may enter the organic light-emitting layer 40 through the via hole 60, causing poor light emission. In this embodiment, the barrier layer 70 is provided on the cathode layer 50, the problem of entry of the external molecules caused by the via hole 60 can be improved.

In an embodiment, the display panel further includes a cover layer 80. The cover layer 80 is disposed on a surface of the barrier layer 70 away from the cathode layer 50. A sealant layer 91 is formed on a periphery of a surface of the cover layer 80 facing the substrate layer 10. The cover layer 80 is attached to the substrate layer 10 through the sealant layer 91. The cover layer 80 is also provided with a gas absorption layer 92 and an adhesive layer 90 disposed on the surface facing the substrate layer. The adhesive layer 90 is disposed inside the sealant layer 91. The gas absorption layer 92 is disposed between the adhesive layer 90 and the sealant layer 91. It is understandable that, in this embodiment, the gas absorption layer 92 is provided on an inner side of the sealant layer 91. The gas absorption layer 92 can effectively absorb certain gas molecules and effectively protect sensitive film layers, such as the cathode layer 50 and the organic light-emitting layer 40.

In an embodiment, the gas absorption layer 92 is desiccant. The adhesive layer 90 is a transparent optical adhesive. The sealant layer 91 is a light-shielding adhesive. It can be understood that the gas absorption layer 92 is specifically desiccant. In this embodiment, by disposing the desiccant in a packaging cavity, the small molecules (such as, water molecules) released from the pixel separating layer 30 or other film layers can be discharged from the via hole 60 and absorbed by the desiccant. The cathode layer 50 and the organic light-emitting layer 40 are prevented from being affected, and the display panel is prevented from being damaged when it is energized. In addition, the adhesive layer 90 adopts the transparent optical adhesive, which has a high transmittance and will not affect a light extraction rate of the display panel. The sealant layer 91 adopts the light-shielding adhesive to prevent light leakage from edges of the display panel.

Figure 6:
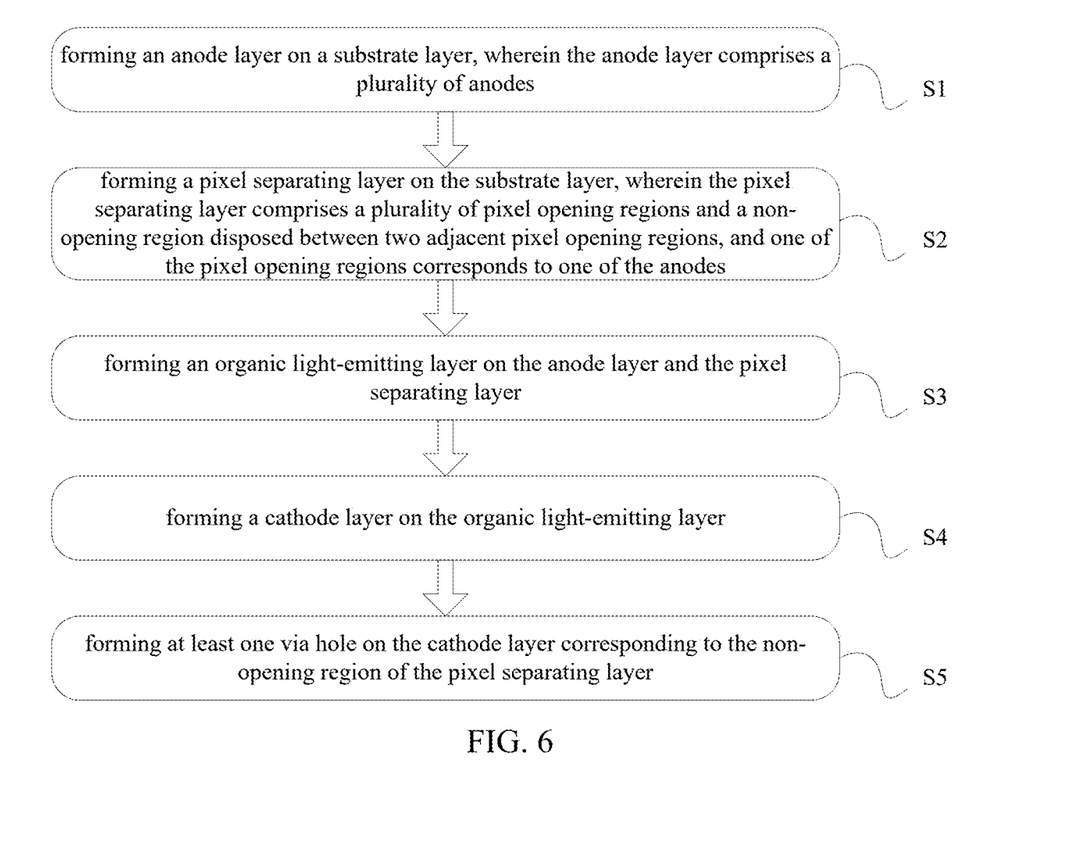
FIG. 6 is a flowchart of a manufacturing method of a display panel of an embodiment of the present disclosure.

Referring to FIG. 6, which is a flowchart of a manufacturing method of a display panel of an embodiment of the present disclosure. The manufacturing method includes the following steps.

S1, an anode layer is formed on a substrate layer. The anode layer includes a plurality of anodes.

S2, a pixel separating layer is formed on the substrate layer. The pixel separating layer includes a plurality of pixel opening regions and a non-opening region disposed between two adjacent pixel opening regions, and one of the pixel opening regions corresponds to one of the anodes.

S3, an organic light-emitting layer is formed on the anode layer and the pixel separating layer.

S4, a cathode layer is formed on the organic light-emitting layer.

S5, at least one via hole is formed on the cathode layer corresponding to the non-opening region of the pixel separating layer.

It should be noted that the via hole is formed on the cathode layer by a laser or exposure etching method. In the present disclosure, the cathode layer is provided with the at least one via hole corresponding to the non-opening region of the pixel separating layer. If the pixel separating layer releases small molecules (e.g., water molecules) due to high temperature or ultraviolet radiation, the small molecules can be discharged from the display panel through this via hole. It prevents the molecules from being released between the cathode layer and the anode layer of the display panel and damaging a contact interface between the cathode layer and the organic light-emitting layer. It prevents poor light emission at edges of sub-pixels and improves the reliability of the display panel.

In an embodiment, the manufacturing method further includes a step of forming a barrier layer on the cathode layer. The barrier layer covers the cathode layer. It is understandable that in the embodiment of the present disclosure, the cathode layer is provided with the at least one via hole corresponding to the non-opening region of the pixel separating layer to discharge small molecules (such as, water molecules) released by the pixel separating layer. However, external molecules may enter the organic light-emitting layer through the via hole, causing poor light emission. In this embodiment, the barrier layer is provided on the cathode layer, the problem of entry of the external molecules caused by the via hole can be improved.

In an embodiment, the barrier layer includes at least one organic layer and at least one inorganic layer. The organic layer and the inorganic layer are stacked. The organic layer is formed by evaporation process. The inorganic layer is formed by a chemical vapor deposition process. Material of the inorganic layer is, for example, silicon dioxide, silicon nitride, silicon oxynitride, or aluminum oxide.

In an embodiment, the manufacturing method further includes steps of providing a cover layer, attaching an adhesive layer to one surface of the cover layer, and attaching the cover layer to a surface of the barrier layer away from the cathode layer through the adhesive layer.

In an embodiment, the manufacturing method further includes a step of providing a cover layer. The cover layer is disposed on a surface of the barrier layer away from the cathode layer, a sealant layer is attached to a periphery of a surface of the cover layer facing the substrate layer, and the cover layer is attached to the substrate layer through the sealant layer.

In an embodiment, the cover layer further includes a gas absorption layer and an adhesive layer disposed on the surface facing the substrate layer. The adhesive layer is disposed inside the sealant layer, and the gas absorption layer is disposed between the adhesive layer and the sealant layer. It is understandable that, in this embodiment, the gas absorption layer is provided on an inner side of the sealant layer. The gas absorption layer can effectively absorb certain gas molecules and effectively protect sensitive film layers, such as the cathode layer and the organic light-emitting layer.

In an embodiment, the gas absorption layer is a desiccant, the adhesive layer is a transparent optical adhesive, and the sealant layer is a light-shielding adhesive. It can be understood that the gas absorption layer is specifically desiccant. In this embodiment, by disposing the desiccant in a packaging cavity, the small molecules (such as, water molecules) released from the pixel separating layer or other film layers can be discharged from the via hole and absorbed by the desiccant. The cathode layer and the organic light-emitting layer are prevented from being affected, and the display panel is prevented from being damaged when it is energized. In addition, the adhesive layer adopts the transparent optical adhesive, which has a high transmittance and will not affect a light extraction rate of the display panel. The sealant layer adopts the light-shielding adhesive to prevent light leakage from edges of the display panel.

An embodiment of the present disclosure also provides a display terminal, including a terminal main body and the above-mentioned display panel. The terminal main body and the display panel are assembled together. For the basic structure and the manufacturing method of the display panel, please refer to FIG. 1 to FIG. 6 and related instructions, which will not be repeated here. The display terminal of the embodiment of the present disclosure may be a product or a component with a display function, such as a mobile phone, a tablet, a notebook, a television, a digital camera, a navigator, etc.

In summary, the embodiment of the present disclosure provides the display panel, including the substrate layer, the anode layer, the pixel separating layer, the organic light-emitting layer, and the cathode layer. The anode layer is disposed on the substrate layer and includes the plurality of anodes. The pixel separating layer is disposed on the substrate layer. The pixel separating layer includes the plurality of pixel opening regions and the non-opening region disposed between two adjacent pixel opening regions, and one of the pixel opening regions corresponds to one of the anodes. The organic light-emitting layer is disposed on the anode layer and the pixel separating layer. The cathode layer is disposed on the organic light-emitting layer. The cathode layer includes at least one via hole corresponding to the non-opening region of the pixel separating layer. In the present disclosure, the cathode layer is provided with the at least one via hole corresponding to the non-opening region of the pixel separating layer. If the pixel separating layer releases small molecules due to high temperature or ultraviolet radiation, the small molecules can be discharged from the display panel through this via hole. It prevents the molecules from being released between the cathode and the anode of the display panel and damaging a contact interface between the cathode and the organic light-emitting layer. It prevents poor light emission at edges of sub-pixels and improves the reliability of the display panel. It solves the technical problems that the pixel separating layer of the display panel in the prior art releases small molecules, resulting in poor contact between the cathode and the organic light-emitting layer, and poor light emission at the edges of the sub-pixel.

The above is a detailed introduction to the display panel, the manufacturing method thereof, and the display terminal of the embodiments of the present disclosure. It should be understood that the exemplary embodiments described herein should only be regarded as descriptive, and used to help understand the method and core idea of the present disclosure, but not to limit the present disclosure.

What is claimed is:

1. A display panel, comprising:
   a substrate layer;
   an anode layer disposed on the substrate layer and comprising a plurality of anodes;
   a pixel separating layer disposed on the substrate layer, wherein the pixel separating layer comprises a plurality of pixel opening regions and a non-opening region disposed between two adjacent pixel opening regions, and one of the pixel opening regions corresponds to one of the anodes;
   an organic light-emitting layer disposed on the anode layer and the pixel separating layer, and
   a cathode layer disposed on the organic light-emitting layer,
   wherein the cathode layer comprises at least one via hole corresponding to the non-opening region of the pixel separating layer; and
   the display panel further comprises a barrier layer, wherein the barrier layer covers the cathode layer and fills the via hole.

2. The display panel according to claim 1, wherein the barrier layer comprises at least one organic layer and at least one inorganic layer, and the organic layer and the inorganic layer are stacked.

3. The display panel according to claim 2, wherein material of the inorganic layer is silicon dioxide, silicon nitride, silicon oxynitride, or aluminum oxide.

4. A manufacturing method of a display panel, comprising:
   forming an anode layer on a substrate layer, wherein the anode layer comprises a plurality of anodes;
   forming a pixel separating layer on the substrate layer, wherein the pixel separating layer comprises a plurality of pixel opening regions and a non-opening region disposed between two adjacent pixel opening regions, and one of the pixel opening regions corresponds to one of the anodes;
   forming an organic light-emitting layer on the anode layer and the pixel separating layer;
   forming a cathode layer on the organic light-emitting layer; and
   forming at least one via hole on the cathode layer corresponding to the non-opening region of the pixel separating layer, forming a barrier layer on the cathode layer, wherein the barrier layer covers the cathode layer.

5. The manufacturing method of the display panel according to claim 4, wherein the barrier layer comprises at least one organic layer and at least one inorganic layer, and the organic layer and the inorganic layer are stacked.

6. The manufacturing method of the display panel according to claim 5, wherein material of the inorganic layer is silicon dioxide, silicon nitride, silicon oxynitride, or aluminum oxide.

7. The manufacturing method of the display panel according to claim 4, wherein the manufacturing method further comprises:
providing a cover layer, attaching an adhesive layer to one surface of the cover layer, and attaching the cover layer to a surface of the barrier layer away from the cathode layer through the adhesive layer.

8. The manufacturing method of the display panel according to claim 4, wherein the manufacturing method further comprises:
providing a cover layer, wherein the cover layer is disposed on a surface of the barrier layer away from the cathode layer, a sealant layer is attached to a periphery of a surface of the cover layer facing the substrate layer, and the cover layer is attached to the substrate layer through the sealant layer.

9. The manufacturing method of the display panel according to claim 8, wherein the cover layer further comprises a gas absorption layer and an adhesive layer disposed on the surface facing the substrate layer, the adhesive layer is disposed inside the sealant layer, and the gas absorption layer is disposed between the adhesive layer and the sealant layer.

10. The manufacturing method of the display panel according to claim 9, wherein the gas absorption layer is a desiccant, the adhesive layer is a transparent optical adhesive, and the sealant layer is a light-shielding adhesive.

11. A display terminal, comprising a terminal main body and a display panel, wherein the terminal main body and the display panel are assembled together, and the display panel comprises:
a substrate layer;
an anode layer disposed on the substrate layer and comprising a plurality of anodes;
a pixel separating layer disposed on the substrate layer, wherein the pixel separating layer comprises a plurality of pixel opening regions and a non-opening region disposed between two adjacent pixel opening regions, and one of the pixel opening regions corresponds to one of the anodes;
an organic light-emitting layer disposed on the anode layer and the pixel separating layer, and
a cathode layer disposed on the organic light-emitting layer,
wherein the cathode layer comprises at least one via hole corresponding to the non-opening region of the pixel separating layer; and
the display panel further comprises a barrier layer, wherein the barrier layer covers the cathode layer and fills the via hole.

12. The display terminal according to claim 11, wherein the barrier layer comprises at least one organic layer and at least one inorganic layer, and the organic layer and the inorganic layer are stacked.

* * * * *